United States Patent
Lin et al.

(10) Patent No.: US 9,147,809 B1
(45) Date of Patent: Sep. 29, 2015

(54) FLIP CHIP LIGHT EMITTING DIODE PACKAGING STRUCTURE

(71) Applicant: ADVANCED OPTOELECTRONIC TECHNOLOGY, INC., Hsinchu Hsien (TW)

(72) Inventors: Hou-Te Lin, Hsinchu (TW); Chao-Hsiung Chang, Hsinchu (TW); Pin-Chuan Chen, Hsinchu (TW); Lung-Hsin Chen, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/686,114

(22) Filed: Apr. 14, 2015

(30) Foreign Application Priority Data

Sep. 3, 2014 (CN) .......................... 2014 1 0445082

(51) Int. Cl.
| | | |
|---|---|---|
| *H01L 33/00* | (2010.01) | |
| *H01L 33/38* | (2010.01) | |
| *H01L 33/50* | (2010.01) | |
| *H01L 33/54* | (2010.01) | |
| *H01L 33/62* | (2010.01) | |
| *H01L 33/64* | (2010.01) | |
| *H01L 33/40* | (2010.01) | |

(52) U.S. Cl.
CPC ................ *H01L 33/38* (2013.01); *H01L 33/40* (2013.01); *H01L 33/507* (2013.01); *H01L 33/54* (2013.01); *H01L 33/62* (2013.01); *H01L 33/647* (2013.01)

(58) Field of Classification Search
CPC ..... H01L 33/641; H01L 33/60; H01L 33/486; H01L 33/642; H01L 33/08; H01L 25/167; H01L 33/62
USPC .................. 257/59, 79, 88, 94–103, E21.511, 257/E21.503; 438/22, 27, 40
See application file for complete search history.

(56) References Cited

U.S. PATENT DOCUMENTS

| | | | | |
|---|---|---|---|---|
| 5,998,232 | A * | 12/1999 | Maruska ......................... | 438/46 |
| 7,453,092 | B2 * | 11/2008 | Suehiro et al. .................. | 257/79 |
| 2006/0049335 | A1 * | 3/2006 | Suehiro et al. ............. | 250/214.1 |
| 2006/0208364 | A1 * | 9/2006 | Wang et al. ................... | 257/778 |
| 2007/0235748 | A1 * | 10/2007 | Tamura et al. .................. | 257/99 |
| 2007/0272940 | A1 * | 11/2007 | Lee et al. ........................ | 257/99 |
| 2009/0179207 | A1 * | 7/2009 | Chitnis et al. ................... | 257/88 |
| 2011/0073900 | A1 * | 3/2011 | Sugizaki ......................... | 257/99 |
| 2011/0260184 | A1 * | 10/2011 | Furuyama ....................... | 257/98 |
| 2012/0302124 | A1 * | 11/2012 | Imazu ............................ | 445/58 |
| 2015/0108527 | A1 * | 4/2015 | Hsieh et al. .................... | 257/98 |

* cited by examiner

*Primary Examiner* — Yosef Gebreyesus

(74) *Attorney, Agent, or Firm* — Novak Druce Connolly Bove + Quigg LLP

(57) ABSTRACT

A flip chip light emitting diode packaging structure includes a substrate and an LED located on the substrate. The LED includes a P electrode and a N electrode. The substrate includes a first electrode and a second electrode mounted on a top surface of the substrate. The first electrode and the second electrode have a first protrusion and a second protrusion. The P electrode and the N electrode are fixed on the top surface of the first protrusion and the second protrusion through the solder. The bottom edge of the P electrode and the N electrode is beyond the top edge of the first protrusion and the second protrusion.

13 Claims, 4 Drawing Sheets

FLIP CHIP LIGHT EMITTING DIODE PACKAGING STRUCTURE

CROSS-REFERENCE TO RELATED APPLICATIONS

This application claims priority to Chinese Patent Application No. 201410445082.0 filed on Sep. 3, 2014, the contents of which are incorporated by reference herein.

FIELD

The subject matter herein generally relates to a flip chip light emitting diode packaging structure.

BACKGROUND

A generally flip chip light emitting diode includes an N type semiconductor layer, a light active layer and a P type semiconductor layer arranged in order. An N electrode is mounted on the N type semiconductor layer, and a P electrode is mounted on the P type semiconductor layer. While the flip chip light emitting diode is encapsulated, the flip is mounted on a substructure, the N electrode and the P electrode is coupled with electrodes of the substrate by sealing. However, the solder is prone to move away the P electrode and the N electrode to cover the substrate, or couple with the P electrode and the N electrode to make a short circuit. The solder moving away the P electrode and the N electrode absorbs light from the light active layer to influence the efficiency of the flip light emitting diode.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure. The description is not to be considered as limiting the scope of the embodiments described herein.

Several definitions that apply throughout this disclosure will now be presented. The term "comprising" means "including, but not necessarily limited to"; it specifically indicates open-ended inclusion or membership in a so-described combination, group, series and the like. The term "coupled" is defined as connected, whether directly or indirectly through intervening components, and is not necessarily limited to physical connections. The connection can be such that the objects are permanently connected or releasably connected.

Figure 1:
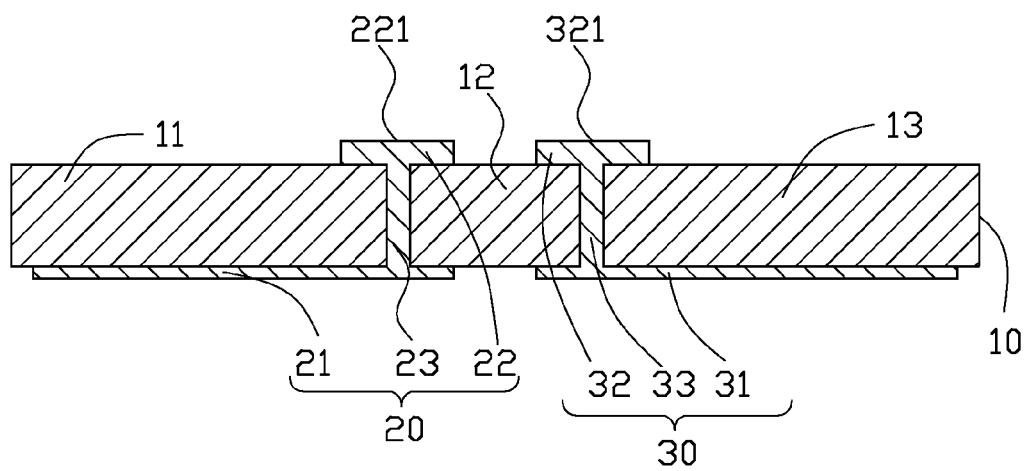
FIG. 1 is a cross section view of a substrate of a flip chip light emitting diode packaging structure of a first embodiment of the present.
Figure 2:
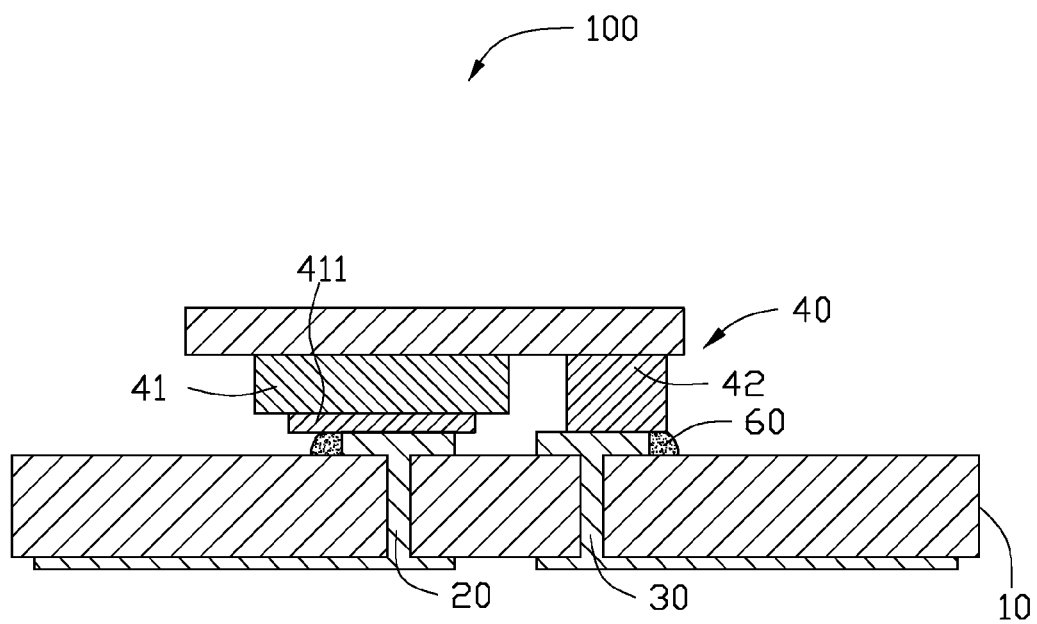
FIG. 2 is a cross section view of the flip chip light emitting diode packaging structure.

Referring to FIGS. 1-2, a flip chip light emitting diode packaging structure 100 of a first embodiment includes a substrate 10, a first electrode 20 and a second electrode 30 extending through the substrate 10, and an light emitting diode packaging (LED) chip 40 mounted on a top side of the substrate 10 and coupled with the first electrode 20 and the second electrode 30.

The substrate 10 is an elongated plate and made of electrical insulation material. The first electrode 20 and the second electrode 30 extend through a top side of the substrate 10 to a bottom side of the substrate 10 to divide the substrate 10 into a first substrate portion 11, a second substrate portion 12 and a third substrate portion 13. The third substrate portion 13 is between the first electrode 20 and the second electrode 30.

The LED chip 40 includes a P electrode 41 and an N electrode 42 made of mental material. The P electrode 41 includes a conductive plate 411 formed on the bottom surface of the P electrode 41. While the LED chip 40 is fixed to the substrate 10, the conductive plate 411 of the P electrode 41 and the N electrode 42 of the LED chip 40 are arranged on the first electrode 20 and the second electrode 30 through a solder 60.

The first electrode 20 and the second electrode 30 are made of thermal conductive material. A height of the first electrode 20 and the second electrode 30 is greater than that of the substrate 10. The first electrode 20 includes a first welding portion 21 located on the bottom side of the substrate 10, a first protrusion 22 located on the top side of the substrate 10, and a first connecting portion 23 coupled with the first welding portion 21 and the first protrusion 22 and embedded in the substrate 10. In the same way, the second electrode 30 includes a second welding portion 31 located on the bottom side of the substrate 10, a second protrusion 32 located on the top side of the substrate 10 and a second connecting portion 33 coupled with the second welding portion 31 and the second protrusion 32 and embedded in the substrate 10. A longitudinal section of the first protrusion 22 and the second protrusion 32 is rectangular, a longitudinal section of the first welding portion 21 and the second welding portion 31 is rectangular, and longitudinal of the first connecting portion 23 and the second connecting portion 33 is also rectangular. An area of a bottom surface of the first welding portion 21 and the second welding portion 31 is greater than a top surface of the first protrusion 22 and the second protrusion 32. The first protrusion 22 and the second protrusion 32 support the LED chip 40 thereon. A sum of the area of the top surface 221 of the first protrusion 22 and the top surface 321 of the second protrusion 32 is smaller than that of the area of the bottom surface of the conductive plate 411 and the bottom surface of the N electrode 42.

While the LED chip 40 is fixing to the substrate 10, the conductive plate 411 of the P electrode 41 and the N electrode 42 are conductively fixed on a top surface 221 of the first protrusion 22 and a top surface 321 of the second protrusion 32 by the solder 60. Because the sum of the area of the top surface 221 of the first protrusion 22 and the top surface 321 of the second protrusion 32 is smaller than that of the area of a bottom surface of the conductive plate 411 of the P electrode 41 and a bottom surface 421 of the N electrode 42, so a bottom edge of the P electrode 41 and the N electrode 42 are beyond a top edge of the first protrusion 22 and the second protrusion 32. The LED chip 40 is fixed on the first protrusion 22 and the second protrusion 32 through the solder 60 filling between the top surface 221 of the first protrusion 22 and the bottom surface of the conductive plate 411, between the top surface 321 of the second protrusion 32 and the bottom surface of the N electrode 42, the solder 60 overflowing the first protrusion 22 and the second protrusion 32 moves along an edge of the first protrusion 22 and the second protrusion 32 under gravity and receives between the bottom edge of the conductive plate 411 and the first protrusion 22, between the N electrode 42 and the second protrusion 32. So the solder 60 overflowing the first protrusion 22 and the second protrusion 32 is limited to lead to a short circuit between the P electrode 41 and the N electrode 42, the solder 60 are prevented from moving to surround the P electrode 41 and the N electrode 42 to absorb the light from the LED chip 40, so an luminous efficiency of the LED chip 40 can be improved.

Figure 3:
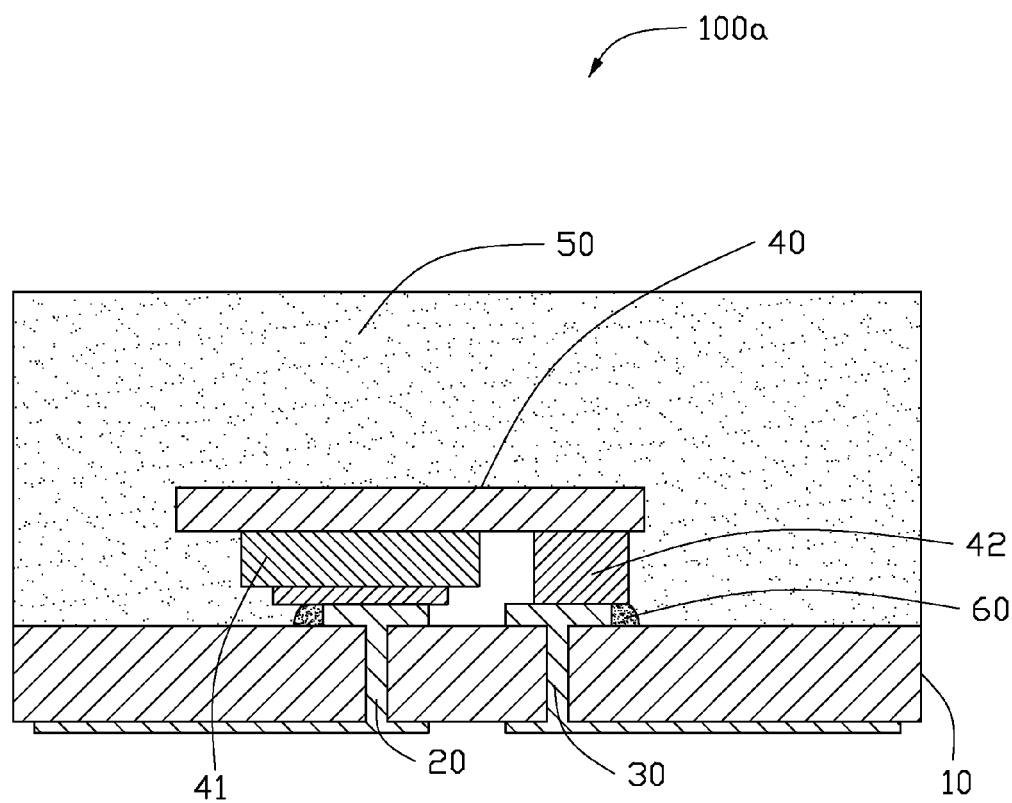
FIG. 3 is a cross section view of a flip chip light emitting diode packaging structure of a second embodiment of the present disclosure.

FIG. 3 illustrates a flip chip light emitting diode packaging structure 100a of a second embodiment. The flip chip light emitting diode packaging structure 100a is similar to the flip chip light emitting diode packaging structure 100, in addition to, the flip chip light emitting diode packaging structure 100a includes an encapsulation layer 50. The encapsulation layer 50 is made of glue and phosphors and covers the LED chip 40 therein to protect the LED chip 40 from dust and water vapor.

Figure 4:
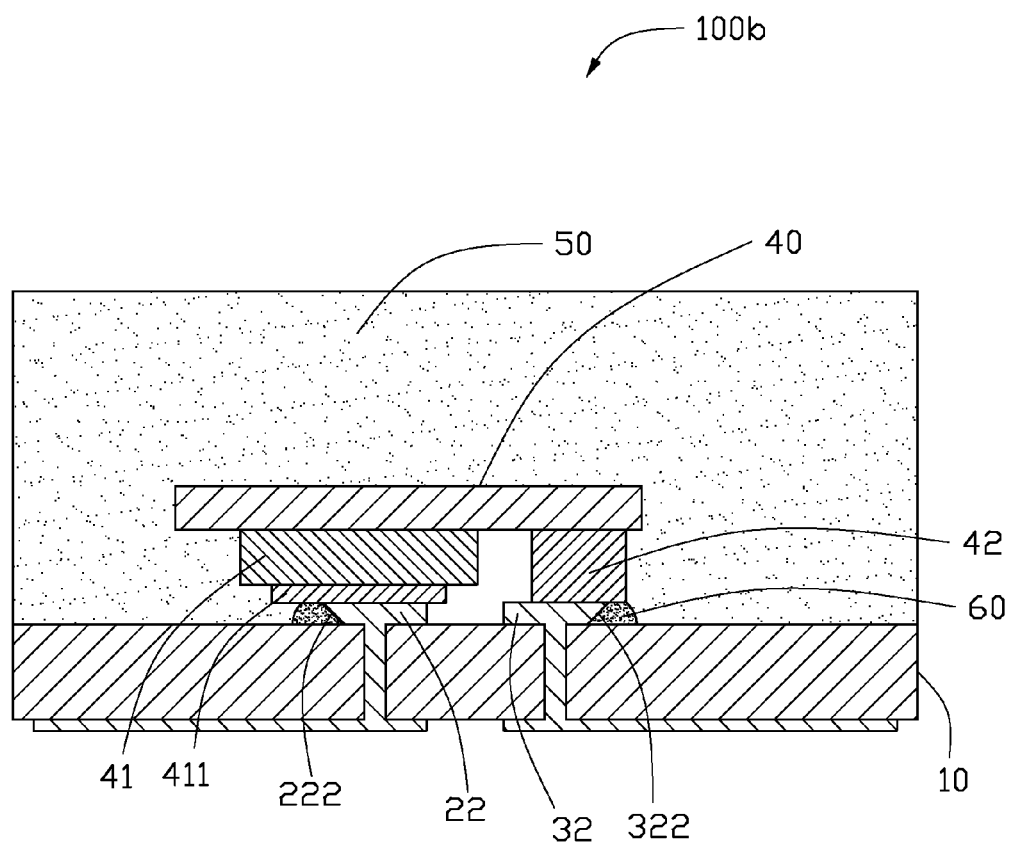
FIG. 4 is a cross section view of a flip chip light emitting diode packaging structure of a three embodiment of the present disclosure.

FIG. 4 illustrates a flip chip light emitting diode packaging structure 100b of a three embodiment. The flip chip light emitting diode packaging structure 100a is similar to the flip chip light emitting diode packaging structure 100a. An end of the first protrusion 22 forms a first rake surface 222, and an end of the second protrusion 32 forms a second rake surface 322. The first rake surface 222 and the second rake surface 322 are good for the solder 60 receiving between the bottom edge of the conductive 411 and the first protrusion 22, between the N electrode 42 and the second protrusion 32.

The embodiments shown and described above are only examples. Many details are often found in the art such as the other features of a flip chip light emitting diode packaging structure. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including the full extent established by the broad general meaning of the terms used in the claims. It will therefore be appreciated that the embodiments described above can be modified within the scope of the claims.

What is claimed is:

1. A flip chip light emitting diode (LED) packaging structure, comprising:
    a substrate including a first electrode and a second electrode;
    an LED chip, wherein the LED chip having a P electrode and an N electrode; and
    wherein the first electrode and the second electrode extends through a top side of the substrate and a bottom side of the substrate, the first electrode further comprises a first protrusion located on the top surface of the substrate, the second electrode further comprises a second protrusion located on the top surface of the substrate; and
    wherein the P electrode includes a conductive plate, the P electrode and N electrode are fixed to the first protrusion and the second protrusion through a solder, a bottom edge of the conductive plate and the N electrode is beyond a top edge of the first protrusion and the second protrusion.

2. The flip chip LED packaging structure of claim 1, wherein the first electrode further comprises a first welding portion located on a bottom surface of the substrate, a first connecting portion coupled with the first welding portion and the first protrusion and embedded in the substrate.

3. The flip chip LED packaging structure of claim 2, a longitudinal section of the first welding portion and the first protrusion and the first connecting portion is rectangular.

4. The flip chip LED packaging structure of claim 3, wherein an area of a bottom surface of the first welding portion is greater than a top surface of the first protrusion.

5. The flip chip LED packaging structure of claim 1, wherein the second electrode further comprises a second welding portion located on a bottom surface of the substrate, a second connecting portion coupled with the second welding portion and the second protrusion and embedded in the substrate.

6. The flip chip LED packaging structure of claim 5, wherein a longitudinal section of the second welding portion, the second protrusion and the second connecting portion is rectangular.

7. The flip chip LED packaging structure of claim 6, wherein an area of a bottom surface of the second welding portion is greater than a top surface of the second protrusion.

8. The flip chip LED packaging structure of claim 1, wherein an encapsulation layer is further included, the encapsulation layer is made of glue and phosphors and cover the LED chip therein.

9. The flip chip LED packaging structure of claim 1, wherein the substrate is made of insulation material.

10. The flip chip LED packaging structure of claim 1, wherein the P electrode and the N electrode are made of mental material.

11. The flip chip LED packaging structure of claim 1, wherein the first electrode and the second electrode are made of thermal conductive material.

12. The flip chip LED packaging structure of claim 1, wherein the sum of the area of the top surface of the first protrusion and the second protrusion is smaller than that of the area of the bottom surface of the conductive plate and the N electrode.

13. The flip chip LED packaging structure of claim 1, wherein an end of the first protrusion forms a first rake surface, and an end of the second protrusion forms a second rake surface.

* * * * *